United States Patent [19]
Mortensen

[11] Patent Number: 5,509,030
[45] Date of Patent: Apr. 16, 1996

[54] RF RECEIVER AGC INCORPORATING TIME DOMAIN EQUALIZER CIRCUITY

[75] Inventor: Duane L. Mortensen, Lucas, Tex.

[73] Assignee: Alcatel Network Systems, Inc., Richardson, Tex.

[21] Appl. No.: 846,496

[22] Filed: Mar. 4, 1992

[51] Int. Cl.⁶ .............................. H03H 7/30; H03H 7/40; H03K 5/159
[52] U.S. Cl. ........................................... 375/232; 375/345
[58] Field of Search .................. 375/98, 11–16; 455/243.1, 240.1; 328/168, 175

[56] References Cited

U.S. PATENT DOCUMENTS 4,665,519  5/1987  Kirchner et al. ................... 370/95.3
4,775,988  10/1988  Chevillat et al. .................... 375/98
5,142,695  8/1992  Roberts et al. ..................... 455/234.1

FOREIGN PATENT DOCUMENTS 9203892  3/1992  WIPO .

Primary Examiner—Stephen Chin
Assistant Examiner—Hai H. Phan
Attorney, Agent, or Firm—Baker & Botts

[57] ABSTRACT

Feedback signals for use in controlling a variable gain amplifier portion of a radio receiver are obtained from existing automatic gain control signals comprising a part of a time domain equalizer section of a receiver such that bandpass filtering and feedback signal detecting circuitry, along with detector circuitry linearization apparatus required in prior art feedback schemes, can be eliminated from the overall scheme. The resulting apparatus provides a constant level to the input of the incorporated analog-to-digital converter and the resultant loop adapts to changing RF/baseband bandwidths.

3 Claims, 2 Drawing Sheets

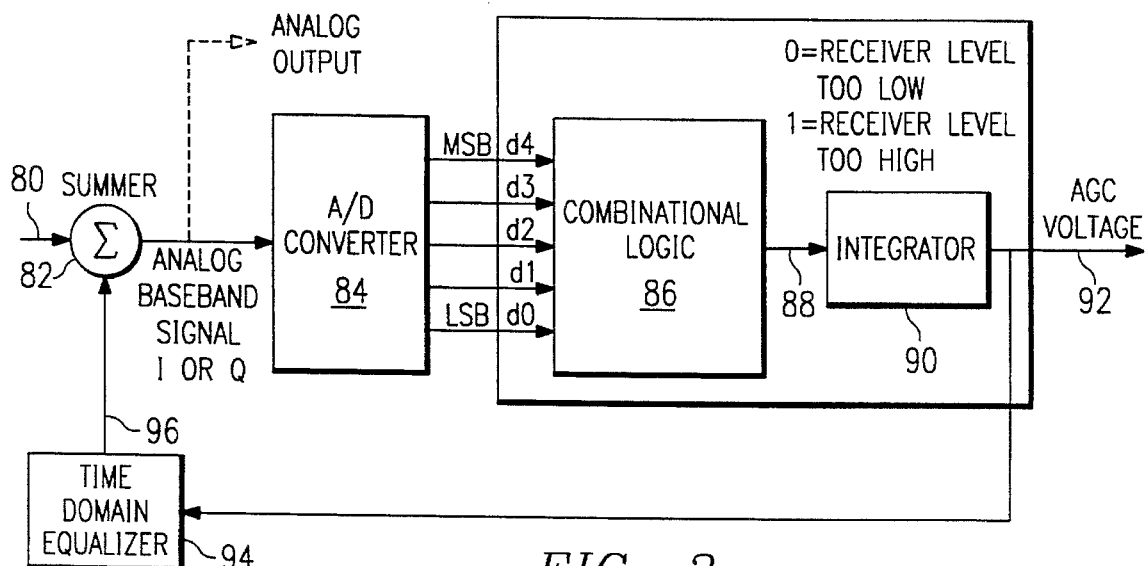
FIG. 3
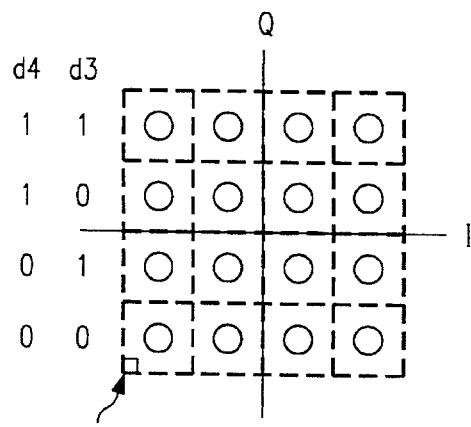
FIG. 4
| d2 | d1 | d0 | LEVEL |
|----|----|----|-------|
| 0 | 0 | 0 | +3 |
| 0 | 0 | 1 | +2 |
| 0 | 1 | 0 | +1 |
| 0 | 1 | 1 | +0 |
| 1 | 0 | 0 | −0 |
| 1 | 0 | 1 | −1 |
| 1 | 1 | 0 | −2 |
| 1 | 1 | 1 | −3 |
FIG. 5
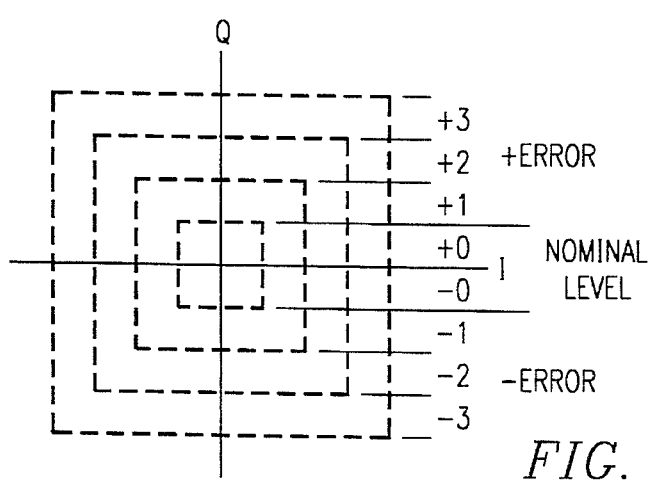
FIG. 6

5,509,030

RF RECEIVER AGC INCORPORATING TIME DOMAIN EQUALIZER CIRCUITRY

THE INVENTION

The present invention is generally directed to electronics and more specifically to automatic gain control (AGC) circuitry. Even more specifically, it is directed to automatic gain control circuitry used in connection with a quadrature amplitude modulated radio receiver incorporating time domain equalization.

BACKGROUND

If a time domain equalizer is used within a radio receiver such as a quadrature amplitude modulated (QAM) radio, an automatic gain control circuit of sorts is typically already incorporated within the time domain equalizer. While the prior art approach to automatic gain control for the overall circuit was to detect the signal, in the form supplied to the down converters and ultimately the time domain equalizer, and bandpass filter this signal, detect it, linearize it, low-pass filter it, threshold detect it, linearize it and supply the resultant signal back as a control voltage to a variable gain amplifier. The bandpass filter, detector, and detector linearizer can be eliminated by using the signal already existant in the time domain equalizer for both time domain equalization signal amplitude stabilization and for overall gain control of the traditionally used variable gain amplifier. This automatic gain control signal can either be from one of the automatic gain control circuits used for each of the quadrature phase signals or can be a combined signal derived from the in-phase and quadrature phase signals. In either event, the overall circuitry is considerably simplified and further, the more nearly constant amplitude signal appearing at the A to D converter reduces the possibility of errors and the overall circuit readily adapts to changing RF/baseband bandwidths.

It is therefore an object of the present invention to provide an improved automatic gain control circuit.

Other objects and advantages of the present invention will be apparent from a reading of the specification and appended claims in conjunction with the drawings wherein:

Figure 2:
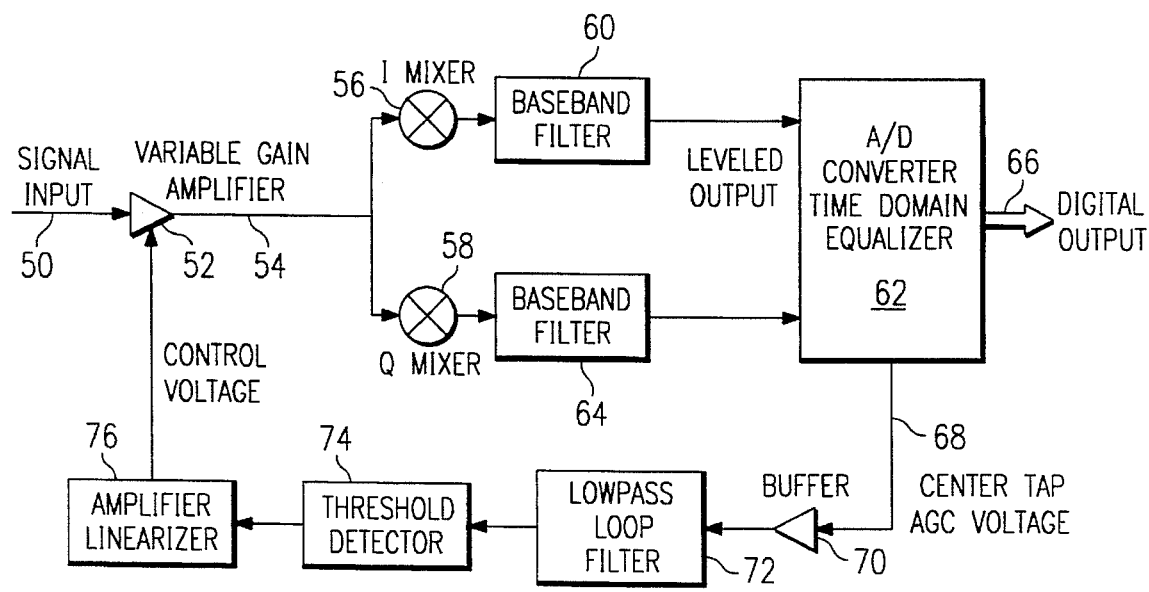
FIG. 2 is a block diagram of the present inventive concept accomplishing the same end result as provided in FIG. 1, although with improved reliability and accuracy under marginal conditions.

FIG. 3 provides more details as to the time domain equalizer portion of FIG. 2; and FIGS. 4, 5 and 6 are used in explaining the operation of the time domain equalizer sections of FIGS. 2 and 3.

DETAILED DESCRIPTION

Figure 1:
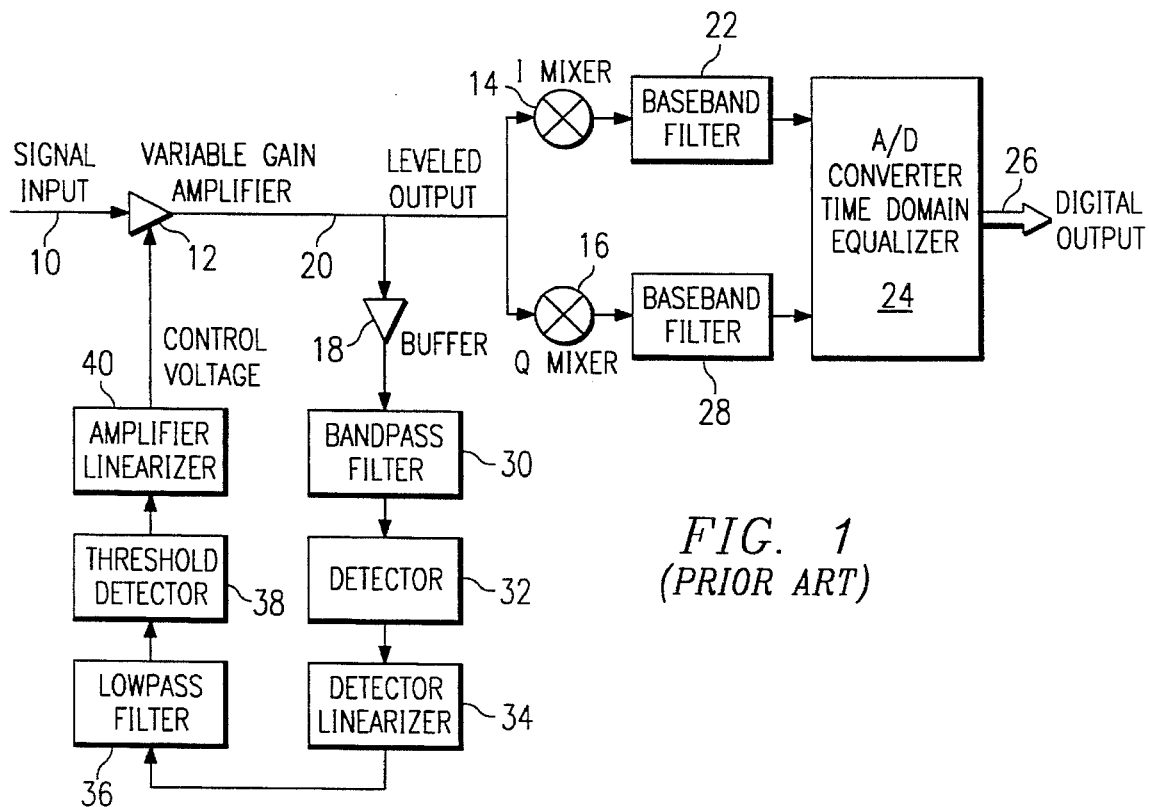
FIG. 1 is a block diagram of prior art circuitry incorporating automatic gain control in connection with time domain equalization.

In FIG. 1 an input signal is applied on lead 10 to a variable gain amplifier 12 whose output is supplied to an in-phase mixer 14, a quadrature phase mixer 16 and a buffer amplifier 18 on a lead 20. This input signal may be RF, IF or baseband in accordance with a given application of equalization requirements. The output of in-phase mixer 14 is supplied to a baseband filter 22 and then to a time domain equalizer block 24 having a set of digital output signals 26. Quad phase mixer signals are output from block 16 to a baseband filter 28 and then to a second input of the time domain equalizer 24. Signals from the buffer 18 are supplied through a bandpass filter 30, a detector 32, a detector linearizer 34, and then on through a low-pass filter 36, a threshold detector 38 and an amplifier linearizer 40 back to a control input of variable gain amplifier 12.

Such an automatic gain control circuit for use in RF systems is described in more detail in many prior art references such as Microwaves and RF August, 1989, Pages 85–93. While the circuit shown in the referenced article is not configured exactly as shown in FIG. 1, it illustrates that many of the components shown are standard.

In FIG. 2 an RF/IF input signal is supplied on a lead 50 to a variable gain amplifier 52 whose output is supplied on a lead 54 to an I or in-phase mixer 56 and a Q or quadrature phase mixer 58. An output signal of in-phase mixer 56 is supplied through a bandpass filter 60 to a first input of an analog-to-digital (A/D) converter and time domain equalizer 62 while an output signal of quadrature phase mixer 58 is supplied through a bandpass filter 64 to a second input of time domain equalizer 62. Block 62 has a set of digital output signals designated as 66 and has an AGC output supplied on a lead 68 to a buffer amplifier 70. The output of buffer amplifier 70 is supplied through a low-pass loop filter 72, a threshold detector 74 and an amplifier linearizer 76 to a control input of variable gain amplifier 52.

The time domain equalizer 62 of FIG. 2 comprises upper and lower pans or portions with the upper portion taking care of the in-phase signals and the lower portion taking care of the quadrature phase signals. FIG. 3 comprises a block diagram of one of the two portions of block 62 where a signal from one of the filters is supplied on a lead 80 to a summing circuit 82 whose output is supplied to an analog-to-digital converter 84. The block 84 provides a plurality of leads to a combinational logic circuit 86. The digital input provides an output on a lead 88 to an integrator 90 of a logic value dependent on the digital input. In other words, it provides a logic "0" whenever the input signal is lower than an axis reference and a logic "1" whenever it is higher. These signals adjust the output of the integrator in a feedback manner. Thus, the output of the integrator 90 is designated as 92 and is an automatic gain control voltage. The blocks 86 and 90 comprise a signal detector for this section of the time domain equalizer. The lead 92 supplies signals to the time domain equalizer (TDE) section involved where the time domain equalizer is designated as 94. TDE 94 supplies automatic gain control signals on a lead 96 to a second input of summer 82. The lead 92 could be the same as lead 68 in FIG. 2 but typically, the automatic gain control signals from the upper and lower sections of the time domain equalizer would be combined in a manner which effectively comprises a center tap or average of the two signals and this average would be used as the feedback signal on lead 68. The AGC within time domain equalizer 62 for each of the sections provides only a comparatively limited range of adjustment of the input signal on lead 80.

In FIG. 4 a representation of a sixteen value quadrature amplitude modulation constellation, the sixteen data locations are coded as a two bit word for each of the in and quadrature phase signals. As illustrated, the lower lefthand corner of the constellation is given the designation of 00 and represents the two most significant bits (MSB) being supplied to the combinational logic block 86.

FIG. 5 illustrates that each of the sixteen data locations of FIG. 4 are further divided into eight more levels. Thus, the full constellation is divided into a five bit representation of 32 levels in each of the in-phase (I) and the quad phase (Q) directions. The nominal location for data is in the plus zero and minus zero levels. All other levels are considered error level from the nominal but are not considered data bit errors. The TDE uses these error levels to determine the correction factors required and thus, the AGC information. Looking at FIG. 6 it will be noted that this is a summarization of the data of FIG. 5 somewhat as outlined above. If just the Q dimension is observed, it would be noted that +0, +1, +2 and +3 would be considered positive error levels. The −0, −1, −2 and −3 levels are considered negative error levels. Above the I axis, positive error levels would correspond to a signal above the nominal receive level and negative errors would be a signal below the nominal receiver level. Below the I axis the reverse is true. The combinational logic block 86 includes logic to determine if a signal is higher or lower than a nominal level and then puts out a logic "1" if it is greater than nominal and a logic "0" if it is less. This signal is supplied on lead 88 to integrator 90 where it becomes an analog voltage representing the relative level of the signal coming into the A/D converter. This voltage is used in the feedback loop represented by lead 92, time domain equalizer 94 and lead 96 to control both the TDE and to supply the detector voltage to control the AGC loop shown in FIG. 2.

As will be realized, a similar set of signals in the I or in-phase dimension would be required to specify which one of the columns is being detected at a given moment. The Q phase dimension can only define the specific row. The combination of these two signals thus defines which one of the sixteen data locations is involved at a given time.

OPERATION

In the prior art attempt to stabilize the level of the widely varying amplitude signals appearing on lead 10 of FIG. 1, a gain control circuit was used. This could either be a variable gain or a variable attenuator but it needed to be something like FIG. 1. In this manner, the level of the signal on lead 20 is relatively stable compared to that at lead 10. However, there can still be changes within the mixers 14 and 16 as well as the filters 22 and 28. In any event, the circuitry of the prior art typically required a buffer to prevent loading of the output signal from amplifier 12, a bandpass filter 30 to limit the frequencies to be fed back to those of interest, a detector 32 and then a linearizer to compensate for non-linearities in the detector 32. Only the low frequency or DC control signal is of interest at the output of the detector 32 and thus, the low pass filter 36 was required along with a threshold detector 38 and an amplifier linearizer 40. The amplifier linearizer 40 was to compensate for non-linearities in the response of variable gain amplifier 12. The present invention was to eliminate some of the circuitry from that shown in FIG. 1 as well as to provide improved stability of signals to the A/D converters within the two portions of time domain equalizer 24.

FIG. 2 illustrates the present concept where it will be noted that a detector and detector linearizer is not required in the feedback loop since there is already a detector within the time domain equalizer used for stabilizing the signals internal to the time domain equalizer. In FIG. 3 the detector essentially constitutes blocks 86 and 90. A buffer 70 is still required to prevent loading of the circuitry within the time domain equalizer and a low pass filter is still utilized to provide as the control signal only essentially the DC component of the detected signal. The threshold detector 74 uses a reference voltage to set the control voltage for a given gain. This is needed to offset the requirements of the variable gain amplifier 52. One embodiment of the invention did not require an amplifier linearizer because the characteristics of the amplifier were linear.

The circuit of FIG. 3 provides more details as to the contents of the time domain equalizer, although the contents of a time domain equalizer are reasonably well-known to those skilled in the art of QAM receivers. The digital signals output on leads 26 or 66 of FIGS. 1 and 2 are essentially that output by the two A/D converters such as converter 84 of FIG. 3. The five bits of the quadrature component and the in-phase components are logically combined by later circuitry to define not only which Of the sixteen data locations are being represented by the incoming signal but the phase of the component in that represented data location. The method in which these signals are combined is beyond the scope of the present invention which is merely concerned with automatic gain control.

As mentioned previously, the five bits as combined in combinational logic 86 provides a logic zero if the signal is a lower amplitude than the I axis and a logic one if it is higher than the I axis. If the signal is within the nominal level, the feedback causes the system to hunt over a very small range. If it is greater than the nominal level in either the plus or minus error range, it moves the signal back so that it falls within the nominal level. From the diagrams of FIGS. 4, 5 and 6 it is apparent that the most significant bit or d4 defines whether it is above or below an axis such as the I axis for Q phase signals while the bit d3 defines whether it is in the upper or lower portion of that side of the I axis. Bits d0, d1 and d2 define the amplitude level of the error signal although the integrator 90 only sees logic zeros and logic ones. While such a system could certainly be designed and is within the concept of the present invention, the circuitry for this approach is simpler.

From the above, it will be seen that the prior art feedback loop of FIG. 1 has performance limitations related to the signal level at the A/D converter 84. This level can change with gain changes between the variable gain amplifier 52 and the A/D converter. Further, out-of-band power in the loop is limited by the performance of the bandpass filter 30. The present invention has the advantages of the level being kept constant at the input of A/D converter 84. Because the detector of the present invention comprising blocks 86 and 90 has a digital input, the detector is linear and does not need the linearization required in block 34 of the prior art. The loop adapts to changing RF/baseband bandwidths whereas the prior art version requires changes of design for bandpass filter 30 with different baseband frequencies. Further, the detector of the present invention receives only the signal of interest and does not have to distinguish or ignore extraneous signals as was required of the detector 32 in the prior art.

As will be apparent to those skilled in the art, the function of the time domain equalizer 62 is to limit the effects of inter-symbol interference. In a QAM system, the TDE also contains information on the relative frequency of the receiver to the transmitter as well as the degree of quadrature of the received constellation of data. The center tap of a typical TDE may also contain circuits which sense the power level of the signal at the A/D converter. The TDE uses all of this information to control multipliers which adaptively shape the received pulses to correct for the above error. Thus, the TDE has limited AGC capability usually not more than 3–6 db of range. This circuitry just mentioned is standard in TDE design and is not required to practice the inventive concept of using the existing AGC detector within the TDE to provide the signal for the overall AGC loop including the variable gain amplifier and eliminate circuitry typically used in the prior art.

I therefore claim a receiver circuit automatic gain control using a time domain equalizer as the source of AGC signal. While I have discussed the invention with respect to given conventional radio receivers, the concept can also be used in many other applications incorporating equalizers such as a digital AM (amplitude modulated) radio.

I therefore wish to be limited, not by the scope of the specific implementation illustrated in the drawings, but only by the scope of the appended claims wherein

I claim:

1. A method of providing automatic gain control (AGC) in a radio receiver comprising the steps of:
  a) gain controllably amplifying a radio frequency input signal to provide a variable amplitude signal;
  b) filtering said variable amplitude signal to provide analog filtered signals;
  c) time domain equalizing (TDE) said analog filtered signals by analog to digital (A/D) converting, logically combining, and integrating same to provide an AGC signal, and returning a version of said AGC signal to a summer at an input of the TDE step for controlling a gain of the TDE step portion of the radio receiver; and
  d) filtering and threshold detecting said AGC signal before using same to gain control said radio frequency input signal.

2. A method of providing automatic gain control (AGC) in a radio receiver comprising the steps of:
  a) gain controllably amplifying a radio frequency input signal to provide a variable amplitude signal;
  b) filtering said variable amplitude signal to provide an analog filtered signal;
  c) time domain equalizing (TDE) said analog filtered signal by analog to digital (A/D) converting, logically combining and integrating same to provide an AGC signal and returning a version of said AGC signal to a summer at an input of the TDE step for controlling a gain of the TDE step portion of the radio receiver; and
  d) filtering and threshold detecting said AGC signal before using same to gain control said radio frequency input signal.

3. A method of providing automatic gain control (AGC) in a radio receiver, comprising the steps of:

gain controllably amplifying a radio frequency input signal to generate a variable amplitude signal;

filtering said variable amplitude signal to generate analog filtered signals;

time domain equalizing said analog filtered signals by analog to digital converting, logically combining, and integrating said analog filtered signals to generate an AGC signal;

summing said AGC signal with said analog filtered signals to control gain through said time domain equalizing step;

buffering said AGC signal to produce a buffered AGC signal;

filtering said buffered AGC signal to produce a filtered AGC signal;

threshold detecting said filtered AGC signal to produce a feedback AGC signal; and summing said feedback AGC signal with said radio frequency input signal to control gain through said gain controllably amplifying step.

* * * * *